United States Patent [19]

Tarng

[11] Patent Number: 5,111,076
[45] Date of Patent: May 5, 1992

[54] DIGITAL SUPERBUFFER

[76] Inventor: Min Ming Tarng, 1367 Glenmoor Way, San Jose, Calif. 95129

[21] Appl. No.: 577,791

[22] Filed: Sep. 5, 1990

[51] Int. Cl.$^5$ .......................................... H03K 17/16
[52] U.S. Cl. ..................................... 307/446; 307/443; 307/554; 307/562; 307/451; 307/496; 307/497
[58] Field of Search .............. 307/554, 562, 451, 494, 307/496, 497, 296.1, 296.8, 475, 446, 443

[56] References Cited

U.S. PATENT DOCUMENTS

| | | | |
|---|---|---|---|
| 4,571,504 | 2/1986 | Iwamoto et al. | 307/451 |
| 4,649,294 | 3/1987 | McLaughlin | 307/451 |
| 4,703,203 | 10/1987 | Gallup et al. | 307/451 |
| 4,714,844 | 12/1987 | Muto | 307/494 |
| 4,730,132 | 3/1988 | Watanabe et al. | 307/451 |
| 4,777,389 | 10/1988 | Wu et al. | 307/475 |
| 4,820,942 | 4/1989 | Chan | 307/475 |
| 4,845,386 | 7/1989 | Ueno | 307/451 |
| 4,890,017 | 12/1989 | Masuda et al. | 307/451 |
| 4,952,818 | 8/1990 | Erdelyi et al. | 307/451 |
| 5,001,365 | 3/1991 | Murabayashi et al. | 307/443 |
| 5,008,568 | 4/1991 | Leung et al. | 307/475 |
| 5,013,937 | 5/1991 | Aoki | 307/475 |

*Primary Examiner*—Stanley D. Miller
*Assistant Examiner*—Scott A. Ouellette

[57] ABSTRACT

The output buffer uses the output feedback control to control the transmission speed of the input signal. With the output feedback control, the NMOS and PMOS has the different switching speed. As the output node switches from 0 to 1 state, the NMOS turns off before the turning on of PMOS. As the output node switches from 1 state to 0 state, the PMOS turns off before the turning on of NMOS. There are the multiple functions: nonoverlapping switch, the soft-turn switch and the speed-up fast switch. The short current between the power and ground is eliminated; the ground bounce and the power surge are reduced.

17 Claims, 4 Drawing Sheets

DIGITAL SUPERBUFFER

BACKGROUND

1. Field of Invention

This invention relates to the output buffers driving a heavy output load with fast switch to minimize output delay but having the minimum power consumption, power surge and ground bouncing.

2. Description of Prior Art

The buffer is to isolate the functional circuit from the output load. In the CMOS digital circuit, the buffer is the inverter. The power surge and ground bounce are serious problems. In the switch of output buffer, there is a period both PMOS and NMOS being on. The power VDD is short to the ground GND. A lot of current flows from power to ground. It causes the ground bounce. To reduces the ground bounce and the power comsumption, the nonoverlapping switching mechanism is introduced. However, the nonoverlapping switch increases the output delay time. Ideally, we want to have both the nonoverlapping switch and the fast switch to minimize the output delay. So far, none of the references has these combinatory superior features. I make the innovative design to overcome the problem. My buffer is nearly the ideal buffer. It has the intelligence to smooth the current density to reduce the ground bouncing. It doesn't have the short circuit between the power and ground. The power consumption is minimized. The peak current is also minimized, too. In the buffer design, I adopt the feedback system theory and the analog circuit design techniques to design. My buffer is simple that it still keeps the high speed characteristics. None of the references has such a novel design.

The U.S. Pat. No. 4,777,389 issued to Wu et. al. on Oct. 11, 1988 which is incorporated herein by reference, used the logic circuit to generate the delay and control signal. The logic gates wastes the layout area and consumes a lot of power. The circuit speed is slowed down. The control is not continuous as the analog signal. The effect of reducing ground bouncing is doubtful. The U.S. Pat. No. 4,820,942 issued to Chan on Apr. 11, 1989 which is incorporated herein by reference, used two buffers, AC buffer and DC buffer. His buffer still uses the logic gates to introduce the delay. He uses 17 gates forty-six transistors in his buffer. Instead of reducing the ground bounce, the fourty-six transistors will consume a lot of power and induce a larger ground bounce. The layout area increases and the circuit speed is slowed down.

The U.S. Pat. No. 4,952,818 issued to Erdelyi on Aug. 28, 1990 which is incorporated herein by reference, used the output feedback to keep the PMOS or NMOS to be partially open and the switch speed is slowed down a lot. HIs circuit has two inverters to drive the PMOS and NMOS separately. On the contrary, in Erdelyi's invention, there is no nonoverlapping mechanism at all. Comapring with my invention, my invention has the nonoverlapping mechanism and output feedback fast switch; Erdelyi's invention doesn't have the nonoverlapping mechanism and the output feedback slows down the switch. My invention is completely different from Erdelyi's invention.

The U.S. Pat. No. 4,649,294 issued to McLaughlin on Mar. 10, 1987 which is incorporated herein by reference, used the output feedback to feed through the input signal to the pull down bipolar. His design completely violates the principle nonoverlapping switch and output feedback switch. My invention uses PMOS to be the output feedback device on the pull-down side; McLaughlin's invention used NMOS to be the output feed-back device on the pull-down side. It induces completely different result. As the output switch from high to low, in McLaughlin, the output feedback NMOS device turns on the pull-down bipolar first. On the contrary, the turning off signal for the pull-up bipolar go throgh one inverter and has much longer delay time. There is a much longer overlapping period to have the power short to the ground. The ground bounce is much larger. Furthermore, as the output switch from high to low, the feedthrough NMOS is disconnected. The switching speed decreases and the output delay increases. Comapring with my invention, my invention has the nonoverlapping mechanism and output feedback fast switch; McLaughlin's invention doesn't have the nonoverlapping mechanism. Even worse, in his invention, the switch overlapping time is much longer. Furthermore, in his invention, the output feedback slows down the switch. So, my invention is completely different from McLaughlin's invention.

OBJECTS AND ADVANTAGES

Using the analog circuit and feedback system design methodologies to design the compact output buffer with minimum power consumption to reduce the ground bounce. There is no logic gates delay that the buffer is much faster than the other buffer. The layout area is much more compact than the other buffers. The output feedback switches on the pull-down and pull-up device fast and smoothly. With the analog circuit and feedback system methodologies, the peak current density is reduced that the power surge and ground bounce are reduced.

DRAWING FIGURES

DESCRIPTION OF THE PREFERRED EMBODIMENTS

Figure 1:
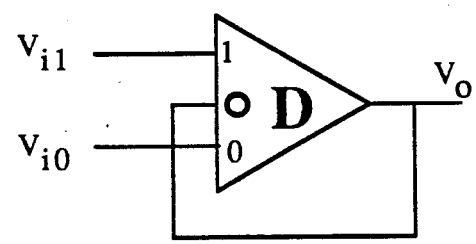
FIG. 1 is the symbol for the output buffer having two inputs Vi0 and Vi1.
Figure 2:
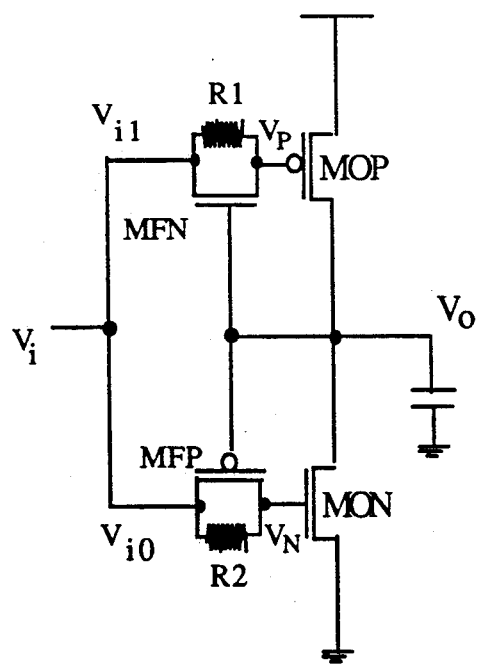
FIG. 2 is the output buffer with the output feedback controlled transmitted gate and RC delay charging pathes; the two inputs Vi0 and Vi1 are connected together to be Vi.

In the CMOS output buffer, as both the NMOS and PMOS devices are on, the power supply $V_{DD}$ is shorted to the ground GND. It induces both the power surge and ground bounce. To reduce the power consumption and the peak current, the PMOS and NMOS must not be on at the same time. Based on the output state, the switching actions are dynamic adjusted. These nonoverlapping switching and dynamic adjustment of the input switching rate cannot be implemented with the logic circuit. They need to use the analog circuit technology and the system feedback control methodology. Furthermore, the analog control is much more compact than the logic control circuit. As shown in FIG. 1, the symbol of the buffer. The output feeds back to the input to control the nonoverlapping and switching rate of gates. The basic pattern of the buffer is shown in FIG. 2. The output voltage Vo has the feedback control over the transmission gate MFN and MFP. The resistors R1 and R2 introduce the RC delay. The devices MFP and MFN, resistors R1 and R2 are adjusted according to the principle of the nonoverlapping switch mechanism. After the voltage $V_P$ is charged up from 0 volts to $(V_{DD}-|V_{th,P}|)$, then the voltage $V_N$ is charged up from 0 volt to $V_{th,N}$; after the voltage $V_N$ is discharged from $V_{DD}$ to $V_{th,N}$, then the voltage $V_P$ is discharged from $V_{DD}$ to $(V_{DD}-|V_{th,P}|)$, where $V_{DD}$ is the power supply voltage, $V_{th,P}$ is the threshold voltage of PMOS and $V_{th,N}$ is the threshold voltage of NMOS.

If the Vi is in 0 state and Vo is in 1 state, MFN is on and MFP is off. As Vi switches from 0 state to 1 state, the charging current flows through MFN and R1 to charge the gate MOP to be 1 state. However, the charging current only flows through R2 to charge up the NMOS device MON. As input switch from low to high, the PMOS device MOP is turned off first then the NMOS device MON is turned on. As the NMOS device MON is turned on, the output voltage Vo is reduced that the PMOS device MFP starts to turn on gradually. The charging rate of the gate of NMOS device starts to increase gradually. The decrement of the drain-source voltage Vo is compensated with the increment of the gate voltage of the NMOS device MON. It has the tendency to keep the draining current through NMOS device MON to be constant. With the nonoverlapping switch and the positive feedback switch control, the peak current and variance of current density are minimized; the ground bounce is reduced.

If the Vi is in 1 state and Vo is in 0 state, MFP is on and MFN is off. As Vi switches from 1 state to 0 state, the discharging current flows through MFP and R2 to discharge the gate MON to be 0 state. However, the discharging current only flows through R1 to discharge the PMOS device MOP. So, the NMOS device MON is turned off first then the PMOS device MOP is turned on. As the MOP is turned on, the output voltage Vo increases that the NMOS device MFN starts to turn on gradually. The discharging rate of the gate of PMOS device MOP starts to increase. The decrement of the drain-source voltage $(V_{DD}-V_O)$ is compensated with the decrement of the gate voltage $V_P$ of the PMOS device MOP. It has the tendency to keep the draining current through PMOS device MOP to be constant. The peak current and variance of current density are minimized. The power surge is reduced.

In the above operations, there is no short circuit between power $V_{DD}$ and ground GND through the PMOS device MOP and NMOS device MON. The effciency of charging and discharging the output load are 100%. So the charging and discharging speed of the output load is much faster. This save time is about the rising time or falling time of the input signal. So the speed is higher. There is no extra power consumption that the peak current is minimized. The feedback control on the switching rate compensates with the variance of drain-source voltage to smooth the current density. So the output buffer has the multi-functions of high speed, no short current between power $V_{DD}$ and ground GND, minimizing peak current, soft turning-on with positive output feedback, reduced ground bounce and power surge.

Figure 3:
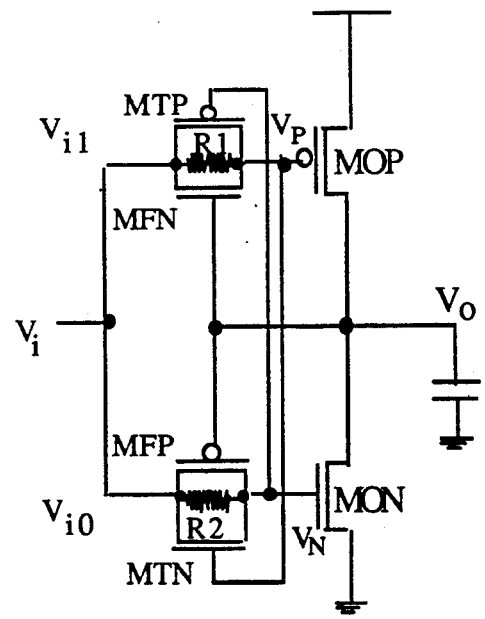
FIG. 3 is the CMOS output buffer with the output feedback controlled transmitted gates and the input controlled transmitted gates; the two inputs Vi0 and Vi1 are connected together to be a two-state buffer.

FIG. 3 is the alternative design of the digital superbuffer. Both the input and output states have the forward control and feedback control on the switching rate. The resistor R1 is in parallel with the PMOS device MTP; the resistor R2 is in parallel with the NMOS device MTN. The role of resistors R1 and R2 is limited to be static; the role of MTP and MTN is the dynamic behavior of charging and switching.

If Vi is in 0 state and Vo is in 1 state, the transmission gates MTP and MFN are on; the transmission gate MFP and MTN is off. As the input Vi switches from 0 state to 1 state, the gate of MOP is charged to be 1 state and MOP is turned off. The turning off of the PMOS device MOP is synchronous with the turning on of the transmitted gate MTN. Since the MTN is partially switched on, to switch on the MON device, it needs more time to have the charging current flowing through the transmission gate MTN device. About 0.2 ns, the voltage $V_P$ is charged from 0 volt to $(V_{DD}-|V_{th,P}|)$, the voltage $V_N$ is only charged from 0 volt to $V_{th,N}$. After the MOP device is turned off, the MON device starts to drain the current from the output load. The decrement of the output voltage will switch on the transmission gate MFP gradually. The charging speed for the gate of MON device increases gradually. For the discharging device MON, the decrement of the drain-source voltage and the increment of the charging rate of MON gate voltage compensate with each other. It makes the discharging current has the tendency to keep constant. The ground bounce is reduced.

If the Vi is in 1 state and Vo is in 0 state, the transmission gates MTN and MFP are on; the transmission gate MFN and MTP is off. As the input Vi switches from 1 state to 0 state, the gate of MON is discharged to be 0 state and MON is turned off. The turning off of the NMOS device MON is synchronous with the turning on of the transmitted gate MTP. Since the MTP is partially switched on gradually, to switch on the MOP device, it needs more time to have the discharging current flowing through the transmission gate MTP device. After the MON device is turned off, the MOP device starts to charge up the output load. The increment of the output voltage will switch on the transmission gate MFN. The discharging rate for the gate of MOP device increases. For the charging device MOP, the decrement of the drain-source voltage and the increment of the discharging rate of gate voltage compensate with each other. The charging current of MOP device has the tendency to keep constant. The power surge is reduced.

Figure 4:
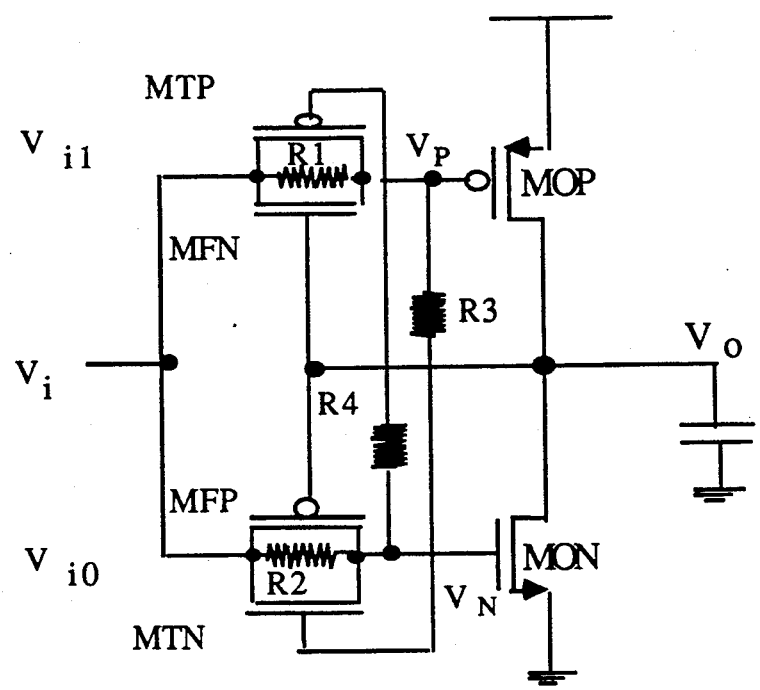
FIG. 4 is the CMOS output buffer with the output feedback controlled transmitted gates and the input delayed switching input; the two inputs Vi0 and Vi1 are connected together to be a two-state buffer.

FIG. 4 is the modified version of the digital buffer as shown in FIG. 3. The resistor R3 is inserted between the gates of MOP and MTN; the resistor R4 is inserted between the gates of MON and MTP. The resistor R3 reduces the charging rate of the gate MTN. In the output load discharging process, the MOP is switched off before the turning on of the MON device. The resistor R4 reduces the charging rate of the gate MTP. In the output load charging process, the MON is switched off before the turning on of the MOP device.

Figure 5:
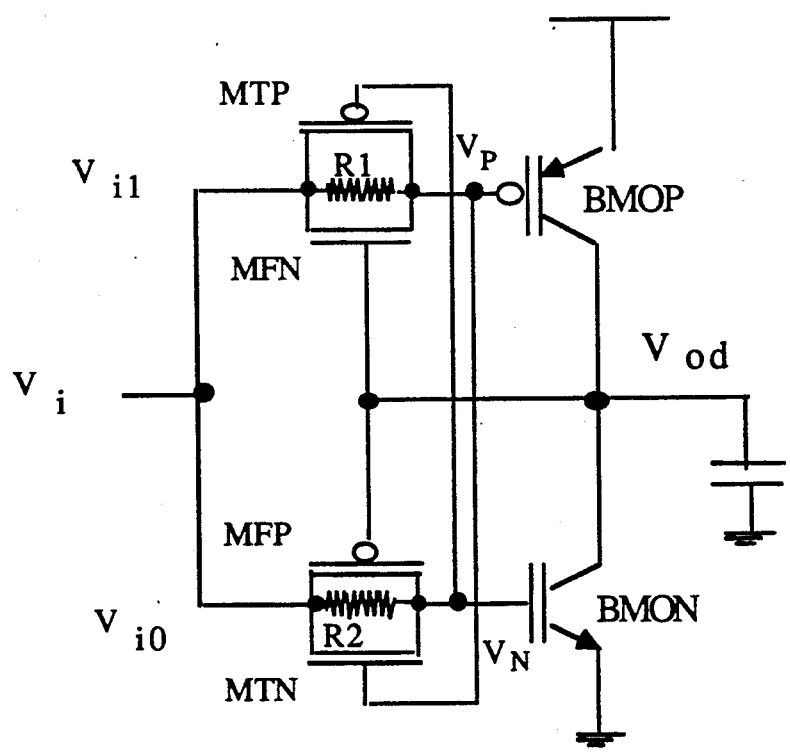
FIG. 5 is the BiCMOS output buffer with the output feedback controlled transmitted gates and the input controlled transmitted gates; the two inputs Vi0 and Vi1 are connected together.
Figure 6A:
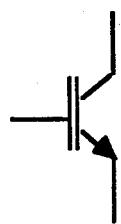
FIGS. 6A and 6B are the symbol and the equivalent circuit of the N-NPN BiMOS device adopted in the BiCMOS output buffer.
Figure 6B:
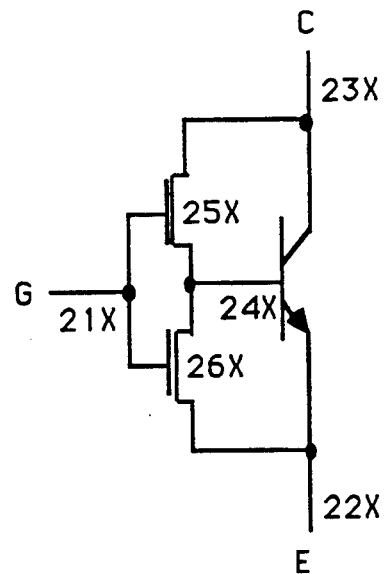
Figure 7A:
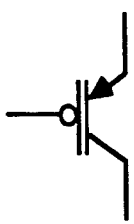
FIGS. 7A and 7B are the symbol and the equivalent circuit of the P-PNP BiMOS device adopted in the BiCMOS output buffer.
Figure 7B:
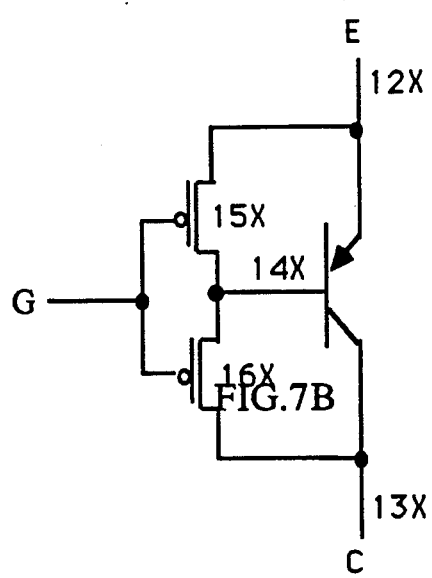

FIG. 5 is the BiCMOS output buffer. The output driver PMOS device MOP in FIG. 4 is replaced with the P-PNP BiMOS device BMOP; the output driver NMOS device MON in FIG. 4 is replaced with the N-NPN BiMOS device BMON. The symbol and equivalent circuit of the N-NPN device are shown in FIG. 6; the symbol and equivalent circuit of the P-PNP device are shown in FIG. 7. The operation of the BiCMOS buffer is the same as the CMOS output buffer. The BiCMOS buffer has much more driving power and uses less layout area.

If the Vi is in 0 state and Vo is in 1 state, the transmission gates MTP and MFN are on; the transmission gate MFP and MTN is off. As the input Vi switches from 0 state to 1 state, the gate of BMOP is charged to be 1 state and BMOP is turned off. Referring to FIG. 7, both the PMOS 15X and 16X are turned off. The base current of PNP bipolar 14X is zero that the PNP bipolar is turned off. The turning off of the P-PNP BiMOS device BMOP is synchronous with the turning on of the transmission gate MTN. Since the MTN is partially switched on gradually, to switch on the MON device, the charging current flowing through the transmission gate MTN device needs more time. After the BMOP device is turned off, the BMON device starts to drain the current from the output load. Referring to FIG. 6, the NMOS devices 25X and 26X are switched on, the current flows into the base of NPN bipolar 24X that the NPN bipolar drains a lot of collector current. The decrement of the output voltage will switch on the transmission gate MFP. The charging rate for the gate of MON device increases. For the discharging device MON, the decrement of the collector-emitter voltage and the increment of the charging rate of gate voltage compensate with each other. The discharging current has the tendency to keep constant. The ground bounce is reduced.

If the Vi is in 1 state and Vo is in 0 state, the transmission gates MTN and MFP are on; the transmission gates MFN and MTP are off. As the input Vi switches from 1 state to 0 state, the gate of MON is discharged to be 0 state and MON is turned off. Referring to FIG. 6, both the NMOS 25X and 26X are turned off. The base current of PNP bipolar 24X is zero that the PNP bipolar is turned off. The turning off of the N-NPN BiMOS device BMON is synchronous with the turn on of the transmitted gate MTP. Since the MTP is partially switched on gradually, the discharging current flowing through the transmission gate MTP device to switch on the BMOP device needs more time. After the BMON device is turned off, the BMOP device starts to charge up the output load. Referring to FIG. 7, the PMOS devices 15X and 16X are switched on, the current flows out of the base of PNP bipolar 14X that the PNP bipolar drives a lot of collector current. The collector current is about 100 times of the current flowing through CMOS 25X, where 100 is the current amplification factor of bipolar device. The increment of the output voltage will switch on the transmission gate MFN. The discharging speed for the gate of BMOP device increases. For the charging device BMOP, the decrement of the collector-emitter voltage and the increment of the discharging rate of gate voltage compensate with each other. The charging current has the tendency to keep constant. The power surge is reduced.

Figure 8:
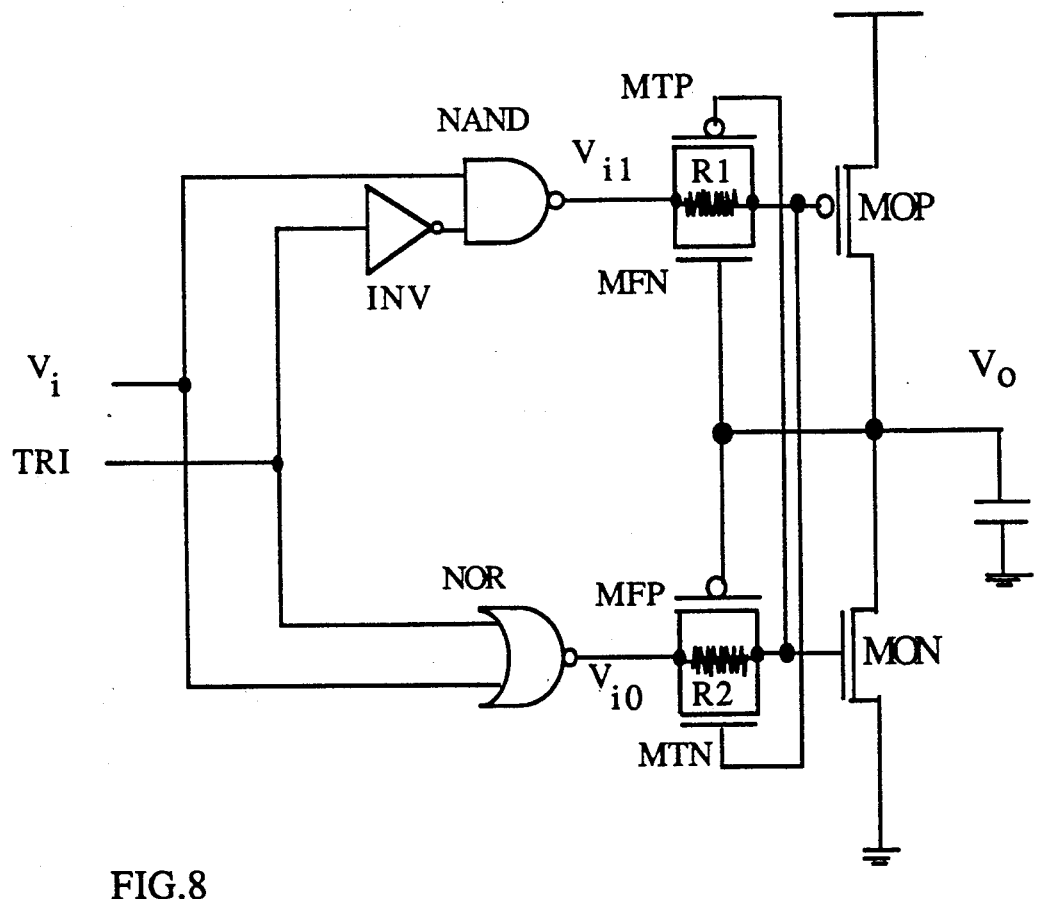
FIG. 8 is the tri-state output buffer; the two inputs Vi0 and Vi1 are connected to the outputs of NAND gate and NOR gate.

FIG. 8 shows the tri-states digital superbuffer. There are two stages in the tri-states digital buffer. The first stage is the well-known logic control circuit of enable signal. The second stage is my output buffer. The illustrated example is the CMOS tri-states output buffer.

As the signal TRI is in 0 state, $V_{i1}$ and $V_{i0}$ are in the same state. The operation of tri-states output buffer is the same as the discussions of output buffer in FIG. 3.

As the signal TRI is in 1 state, the tri-state buffer is in high output impedance situation. Vi1 is in 1 state; Vio is in 0 state. If Vo switches from 1 state to tri-states, Vi1 is in 1 state, Vio is in 0 state. As the Vo is in 1 state, MFN and MTP are on. The gate of MOP switches from 0 state to 1 state and MTN is on. The gate of MON still stays in 0 state. If Vo switches from 0 state to tri-states, Vi1 is in 1 state, Vio is in 0 state. As the Vo is in 0 state, MFP and MTN are on. The gate of MON switches from 1 state to 0 state and MTP is on. The gate of MOP still stays in 1 state. The tri-state buffer still keeps the high speed characteristics. After the buffer is in the tri-state, the gates MOP and MTN are in 1 state; the gates MON and MTP are in 0 state. So the tri-state are stable.

In the above discussions, the circuits are illustrated. While the invention has been particularly shown and described with reference to the preferred embodiments thereof, it will be understood by those skilled in the art that various changes in form and detail may be made therein without departing from the spirit and scope of the invention.

What I claim is:

1. A buffer comprising
a first and second supply voltages,
an output stage comprising an output terminal, a first transistor connected between said output terminal and said first supply voltage, a second transistor connected between said output terminal and said second supply voltage,
an input terminal,
a first control means connected between said input terminal and said first transistor,
a second control means connected between said input terminal and said second transistor,
said first control means comprising a third transistor having a gate connected to said output terminal and forming a current path between said input terminal and a gate of said first transistor,
said second control means comprising a fourth transistor having a gate connected to said output terminal and forming a current path between said input terminal and a gate of said second transistor.

2. A buffer as claimed in claim 1, wherein said first and fourth transistors are PMOS's and said second and third transistors are NMOS's.

3. A buffer as claimed in claim 1, wherein said first and fourth transistors are PFET's and said second and third transistors are NFET's.

4. A buffer as claimed in claim 1, wherein said first control means further comprises a resistor connected between said input terminal and the gate of said first transistor.

5. A buffer as claimed in claim 1, wherein said second control means further comprises a resistor connected between said input terminal and the gate of said second transistor.

6. A buffer comprising
a first and second supply voltages,
an output stage comprising an output terminal, a first transistor connected between said output terminal and said first supply voltage, a second transistor connected between said output terminal and said second supply voltage,
an input terminal,
a first control means coupled between said input terminal and said first transistor,
a second control means coupled between said input terminal and said second transistor,
said first control means comprising a third transistor having a gate connected to said output terminal and forming a first current path between said input terminal and a gate of said first transistor, a fourth transistor having a gate coupled to a gate of said second transistor and forming a second current path between said input terminal and the gate of said first transistor, said second control means comprising a fifth transistor having a gate connected to said output terminal and forming a first current path between said input terminal and a gate of said second transistor, a sixth transistor having a gate coupled to the gate of said first transistor and forming a second current path between said input terminal and the gate of said second transistor.

7. A buffer as claimed in claim 6, wherein said first, fourth and fifth transistors are P-type field effect transistors, said second, third and sixth transistors are N-type field effect transistors.

8. A buffer as claimed in claim 6, wherein said first control means further comprises a first resistor forming a third current path between said input terminal and the gate of said first transistor, and said second control means further comprises a second resistor forming a third current path between said input terminal and the gate of said second transistor.

9. A buffer as claimed in claim 6, further comprising a third resistor connected between the gate of said first transistor and the gate of said sixth transistor, and a fourth resistor connected between the gate of said second transistor and the gate of said fourth transistor.

10. A buffer as claimed in claim 6 further comprising a second input signal, an inverter, a NAND gate and a NOR gate,
said NAND gate being inserted between said first input terminal and said first control means having a first input from said first input terminal and a second input from said inverter, said inverter having an input from said second input terminal and having an output being connected to said NAND gate,
said NOR gate being inserted between said first input terminal and said second control means having a first input from said first input terminal and a second input from said second input terminal,
said NAND gate having an output connected to an input of said first control means, said NOR gate having an output connected to an input of said second control means.

11. A buffer comprising
a first and second supply voltages,
an input terminal,
an output terminal,
a pull-up circuit connected between said first supply voltage and said output terminal,
a pull-down circuit connected between said output terminal and said second supply voltage,
a first control means connected between said input terminal and said pull-up circuit,
a second control means connected between said input terminal and said pull-down circuit,
said first control means comprising a plurality of current paths between said input terminal and said pull-up circuit and receiving feedback control from said output terminal and said second control means,
said second control means comprising a plurality of current paths between said input terminal and said pull-down circuit and receiving feedback control from said output terminal and said first control means.

12. A buffer as claimed in claim 11, wherein said pull-up circuit comprises a PNP bipolar transistor connected between said first supply voltage and said output terminal, a first P-channel field effect transistor connected between said first supply voltage and a base of said PNP bipolar, a second P-channel field effect transistor connected between said base and said output terminal, said first and second P-channel field effect transistors receiving gate control fron said first control means.

13. A buffer as claimed in claim 11, wherein said pull-down circuit comprises an NPN bipolar transistor connected between said second supply voltage and said output terminal, a first N-channel field effect transistor connected between said second supply voltage and a base of said NPN bipolar transistor, a second N-channel field effect transistor connected between said base and said output terminal, said first and second N-channel field effect transistors receiving gate control fron said second control means.

14. A buffer as claimed in claim 11, wherein said first control means comprises a first transistor forming a first current path between said input terminal and said pull-up circuit, a second transistor forming a second current path between said input terminal and said pull-up circuit, and a resistor forming a third current path between said input terminal and said pull-up circuit, said first transistor having a gate connected to said output terminal, said second transistor having a gate connected to an input of said pull-down circuit.

15. A buffer as claimed in claim 14, wherein said first transistor is an N-type field effect transistor and said second transistor is a P-type field effect transistor.

16. A buffer as claimed in claim 11, wherein said second control means comprises a first transistor forming a first current path between said input terminal and said pull-down circuit, a second transistor forming a second current path between said input terminal and said pull-down circuit, and a resistor forming a third current path between said input terminal and said pull-down circuit, said first transistor having a gate connected to said output terminal, said second transistor having a gate connected to an input of said pull-up circuit.

17. A buffer as claimed in claim 16, wherein said first transistor is a P-type field effect transistor and said second transistor is an N-type field effect transistor.

* * * * *